United States Patent
Cho et al.

(10) Patent No.: US 10,107,894 B2
(45) Date of Patent: Oct. 23, 2018

(54) RADIO-WAVE-PENETRABLE LAYER HAVING METALLIC LUSTER

(71) Applicants: Hyundai Motor Company, Seoul (KR); Kia Motors Corporation, Seoul (KR)

(72) Inventors: Byung Kyu Cho, Seoul (KR); Seung Chan Hong, Gyeonggi-Do (KR); So Jung Shim, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/351,557

(22) Filed: Nov. 15, 2016

(65) Prior Publication Data
US 2017/0168137 A1   Jun. 15, 2017

(30) Foreign Application Priority Data

Dec. 9, 2015   (KR) .................. 10-2015-0175332
Sep. 8, 2016   (KR) .................. 10-2016-0115705

(51) Int. Cl.
*B60R 19/52*   (2006.01)
*G02B 1/14*   (2015.01)
(Continued)

(52) U.S. Cl.
CPC .............. *G01S 7/023* (2013.01); *B60R 19/52* (2013.01); *B60W 30/143* (2013.01);
(Continued)

(58) Field of Classification Search
CPC .... G01S 7/023; G01S 13/88; G01S 2007/027; G02B 1/14; B60R 19/52; B60R 2019/525; B60W 30/143; C23C 14/0015; C23C 14/022; C23C 14/083; C23C 14/086; C23C 14/10; C23C 14/30; H01Q 1/3233; H01Q 1/42
See application file for complete search history.

(56) References Cited

U.S. PATENT DOCUMENTS 9,834,155 B2 * 12/2017 Gong .................... B60R 13/005
2007/0109206 A1   5/2007 Fujii et al.
(Continued)

FOREIGN PATENT DOCUMENTS

DE   102011016683 A1   8/2010
DE   102009025950 A1   12/2010
(Continued)

OTHER PUBLICATIONS

European Search Report for European Patent Application No. 16199437, dated May 24, 2017, 7 pages.

*Primary Examiner* — Gregory A Blankenship
(74) *Attorney, Agent, or Firm* — Mintz Levin Cohn Ferris Glovsky and Popeo, P.C.; Peter F. Corless (57) ABSTRACT

Disclosed is a coating layer penetrable by radio wave and having a metallic luster. The coating layer includes a resin layer as an outmost layer to an exterior or front, a metallic texture layer formed on a rear side of the resin layer and comprising a optical film layer including metal oxides having different refractive indexes, and a germanium (Ge) layer to reflect light and a reflection layer formed on the rear side of the metallic texture layer.

14 Claims, 7 Drawing Sheets

(51) Int. Cl.
*C23C 14/02* (2006.01)
*C23C 14/10* (2006.01)
*G01S 7/02* (2006.01)
*C23C 14/30* (2006.01)
*G02B 5/08* (2006.01)
*B60W 30/14* (2006.01)
*C23C 14/00* (2006.01)
*C23C 14/08* (2006.01)
*H01Q 1/32* (2006.01)
*H01Q 1/42* (2006.01)
*G01S 13/93* (2006.01)
*G01S 13/88* (2006.01)

(52) U.S. Cl.
CPC ........ *C23C 14/0015* (2013.01); *C23C 14/022* (2013.01); *C23C 14/083* (2013.01); *C23C 14/086* (2013.01); *C23C 14/10* (2013.01); *C23C 14/30* (2013.01); *G01S 13/931* (2013.01); *G02B 1/14* (2015.01); *G02B 5/0816* (2013.01); *H01Q 1/3233* (2013.01); *H01Q 1/42* (2013.01); *B60R 2019/525* (2013.01); *G01S 13/88* (2013.01); *G01S 2007/027* (2013.01)

(56) References Cited

U.S. PATENT DOCUMENTS

| | | | |
|---|---|---|---|
| 2010/0015434 A1* | 1/2010 | Iwata | C08G 18/6216 428/327 |
| 2012/0119961 A1 | 5/2012 | Mayer Pujadas | |
| 2014/0354465 A1* | 12/2014 | Lee | G01S 17/936 342/70 |
| 2017/0168137 A1* | 6/2017 | Cho | G01S 13/931 |
| 2018/0056910 A1* | 3/2018 | Hong | B60R 19/52 |
| 2018/0090831 A1* | 3/2018 | Frayer | H01Q 1/42 |
| 2018/0090832 A1* | 3/2018 | Takahashi | H01Q 1/42 |

FOREIGN PATENT DOCUMENTS

| | | |
|---|---|---|
| JP | 2002-135030 A | 5/2002 |
| JP | 2003-270432 A | 9/2003 |
| JP | 2009-092913 A | 4/2009 |
| JP | 2010-188713 A | 9/2010 |
| KR | 10-2015-0095411 | 8/2015 |
| WO | 2012-066417 A1 | 5/2012 |

* cited by examiner

RADIO-WAVE-PENETRABLE LAYER HAVING METALLIC LUSTER

CROSS REFERENCE TO RELATED APPLICATION

The present application claims priority to Korean Patent Application No. 10-2015-0175332, filed Dec. 9, 2015 and No. 10-2016-0115705, filed Sep. 8, 2016, the entire content of which is incorporated herein for all purposes by this reference.

TECHNICAL FIELD

The present invention relates to a coating layer, or particularly a radio-wave-penetrable coating layer having a metallic luster, such that the coating layer of the present invention may protect SCC radar while radio waves may penetrate the coating layer.

BACKGROUND OF THE INVENTION

A smart cruise control (SCC) system detects movement of a preceding vehicle using a radar mounted on a front portion of a vehicle, thereby controlling engine and brakes to maintain a distance from the preceding vehicle.

An SCC radar, which is an essential part of the system, is most preferably provided at the front center of the vehicle in order to ensure excellent performance. A radiator grill or the emblem or the decoration of a vehicle maker is commonly positioned at the front center of the vehicle.

Typically, the radiator grill is made of metal and plated with chrome to prevent corrosion.

However, metal adversely affects the transmission and perturbs reception of the radio waves of the SCC radar due to the low radio-wave penetrability thereof. Therefore, efforts to replace a portion of the radiator grill with a separate radar cover have been made in order to ensure predetermined radio-wave penetrability to thus smoothly transmit and receive radio waves.

However, the radar cover has been manufactured without metal in order to ensure radio-wave penetrability. Accordingly, the radar cover does not have consistency in design with respect to the radiator grill made of metal.

In order to solve the problem, a technology for applying indium or tin, having excellent radio-wave penetrability, to a portion of a conventional radar cover to thus implement a metallic texture has been developed.

Figure 1:
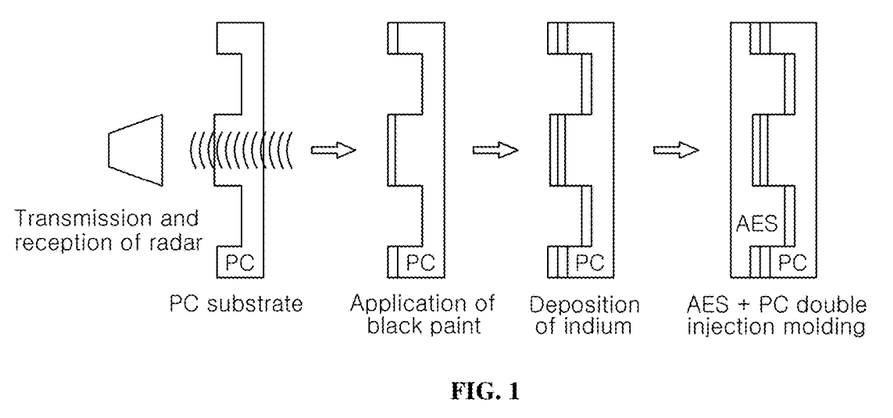
FIG. 1 illustrates a conventional SCC cover using indium deposition in the related arts.

For example, as shown in FIG. 1, black paint is applied on a transparent layer of a PC material in order to expose only a portion intended to exhibit a metallic texture, indium is deposited thereon, and the rear side of a cover is subjected to double injection molding using an AES material, thus manufacturing a conventional SCC cover.

However, the cost of a radar unit may be increased because indium or tin is a relatively expensive material and in that the durability of the cover, which is adjacent to the vehicle engine, may be reduced due to the low melting point of the material.

Details described as the background art are provided for the purpose of better understanding the background of the invention, but are not to be taken as an admission that the described details correspond to the conventional technology already known to those skilled in the art.

SUMMARY OF THE INVENTION

In preferred aspects, the present invention provides a coating layer having a metallic luster, which may not be thermally deformed at high temperatures and may be manufactured using a low-priced material. The coating layer of the present invention may implement a metallic texture while maintaining predetermined radio-wave penetrability.

In one aspect, the present invention provides a coating layer having a metallic luster, which may be provided on the front grill of a vehicle and allow radio waves of a radar to penetrate. The coating layer may comprise: a resin layer having a front side exposed to an outside and a rear side opposite to the front side, a metallic texture layer formed on the rear side of the resin layer and comprising i) an optical film layer comprising metal oxides having different refractive indexes and ii) a germanium (Ge) layer configured to reflect light, and a reflection layer formed on a rear side of the metallic texture layer.

The term "germanium (Ge) layer" as used herein refers to a layer including elemental germanium or compound comprising germanium as a main component, for instance, in an amount greater than about 50 wt %, greater than about 60 wt %, greater than about 70 wt %, greater than about 80 wt %, greater than about 90 wt %, or greater than about 95 wt % based on the total weight of the germanium layer. Preferred composition of the Ge layer may include substantially pure elemental germanium.

The term "metallic texture layer" as used herein refers to a layer providing a texture obtained from metal or metallic substances, without limitations to shape or topology thereof. For instance, preferred metallic texture layer may provide textures of "matte", "glossy", "embossed", "scratched", "etched", "recessed", "rough", or combinations thereof, which can be obtained by various deposition of metallic compounds, for instance, including Ge or Cr.

The term "optical film layer" as used herein refers to a layer formed in a film having a thickness less than about 100 μm, less than about 50 μm, or particularly less than about 100 μm. Preferred thickness for the film may be from about 300 nm to about 10 μm without limitations to a number of layers constituting the optical film layer.

Preferably, the resin layer may be transparent and the reflection layer may be opaque.

The term "radio-wave" as used herein refers to a portion of an electromagnetic radiation having frequencies from about 76~77 GHz.

The term "transparent" material or "transparent" resin, as used herein, may refer to a material having substantial transmittance of a fraction of light, such as visible light. For instance, substantial amount of visible light such as of about 50%, about 60%, about 70%, about 80%, about 90%, about 95%, about 99%, or greater thereof may transmit or pass through the transparent material or resin.

The term "opaque" material or "opaque" resin, as used herein, may refer to a material blocking, reflecting or screening substantial transmittance of a fraction of light, such as visible light. Alternatively, the opaque material or resin may reflect substantial transmittance of a fraction of light. For instance, substantial amount of visible light such as of about 50%, about 60%, about 70%, about 80%, about 90%, about 95%, about 99%, or greater thereof may be blocked or reflected by the opaque material or resin.

The optical film layer may comprise a first refractive layer, comprising $TiO_2$ or $Cr_2O_3$, and a second refractive layer, comprising $SiO_2$. Preferably, in the optical film layer, the first refractive layer and the second refractive layer are alternately layered. The high refractive layer may be disposed closer to the resin layer than the second refractive layer.

The metallic texture layer may have a reflectance of about 30% or greater and a reflectance deviation of about 5% P or less in a visible ray region at a wavelength of about 400 to 700 nm.

Preferably, each of the first refractive layer and the second refractive layer may have a thickness of about 10 to 200 nm. The optical film layer suitably may comprise three or more layers and has a total thickness of about 300 nm to 10 μm.

The germanium layer may be disposed on a front side of the optical film layer, on a rear side of the optical film layer, or between the alternately layered first refractive layer and the second refractive layer.

The germanium layer suitably may have a total thickness of about 50 nm to 5 μm.

The resin layer may have a flat or curved front surface having no concavo-convex portion and a rear surface having a concave portion and a convex portion.

The coating layer may further comprise a primer layer formed between the resin layer and the metallic texture layer.

The coating layer further comprise a masking layer formed between the resin layer and the metallic texture layer to cover at least a portion of the metallic texture layer. The masking layer suitably may comprise an opaque paint for covering a remaining portion other than a portion having a predetermined shape.

Further provided is a vehicle part that may comprise the coating layer as described herein. Exemplary vehicle parts may include a front grill of the vehicle.

In another aspect, the present invention provides a method of producing a coating layer, comprising: washing and activating a surface of a resin layer using a plasma converted from argon gas; radiating an electron beam using a first refractive material and a second refractive material to form a multilayered optical film layer on the surface of the resin layer, radiating an electron beam using germanium to form a germanium layer. Preferably, the first refractive material may include $TiO_2$ and/or $Cr_2O_3$ and the second refractive material may include $SiO_2$.

The germanium layer suitably may be disposed on a front side of the multilayered optical film layer, on a rear side of the multilayered optical film layer, or between the first refractive material and the second refractive material.

Other aspects of the invention are disclosed infra.

A coating layer having a metallic luster according to exemplary embodiments of the present invention may provide following effects.

First, metal oxides comprising a semiconductor material such as a ceramic and germanium may be applied to reflect light on the radar cover, thereby exhibiting a metallic texture.

Second, the radio waves of an SCC radar may be smoothly transmitted and received due to the high radio-wave penetrability of the ceramic and the semiconductor applied to the radar cover.

Third, thermal deformation at high temperatures may be prevented using metal oxide and germanium, which have high melting points.

Fourth, reflected light may be applied so as to exhibit a metallic texture similar to that of the radiator grill of a vehicle, thereby maintaining continuity and the consistency of appearance of the vehicle.

Fifth, although the coating layer has an uneven and steric shape, reflectance having a predetermined value or greater and variation having a predetermined value or less may be ensured so that an achromatic metallic texture may be exhibited.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Unless defined otherwise, all the terms used in this specification, including technical and scientific terms, have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

Hereinafter, a coating layer that may be penetrable by radio wave and have a metallic luster according to preferred embodiments of the present invention will be described with reference to the accompanying drawings.

Figure 2:
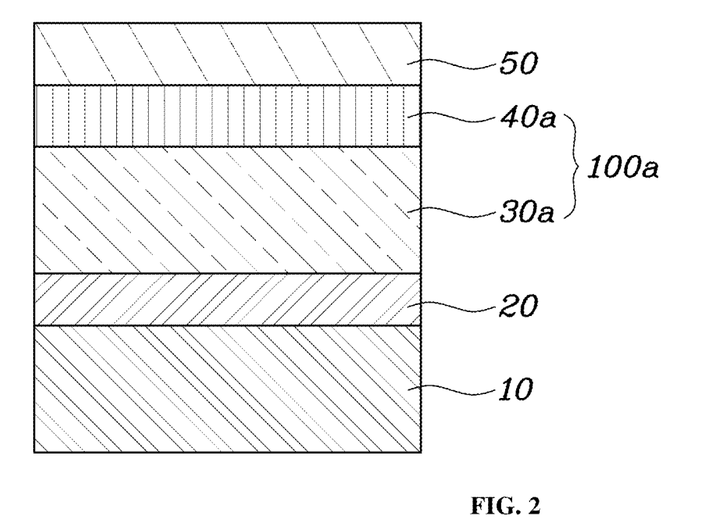
FIG. 2 illustrates an exemplary structure of an exemplary coating layer having a metallic luster according to an exemplary embodiment of the present invention.

FIG. 2 shows a simplified sectional view of an exemplary embodiment of the present invention. As shown in the drawing, an exemplary coating layer having the metallic luster according to the present invention may include a transparent resin layer 10, a metallic texture layer 100a that reflects light to exhibit a metallic texture, and a reflection layer 50 for improving the reflectance of the metallic texture layer 100a. The radio-wave-penetrable layer or coating layer may further include a primer layer 20 between the resin layer 10 and the metallic texture layer 100a.

The resin layer 10 may be transparent, for example, by including transparent plastics, for example, polycarbonate and acryl resins, and may constitute the outermost portion of the coating layer according to the present invention. For instance, the resin layer 10 may be a front surface of a front grill of a vehicle. Preferably, the resin layer 10 may be transparent. Accordingly, external light may be transmitted to the metallic texture layer 100a while the metallic texture layer 100a is protected, or light that is reflected on the metallic texture layer 100a to exhibit a metallic texture may be transmitted through the resin layer to the outside.

The resin layer 10 suitably may have an even flat or curved front side and an uneven rear side having a concavo-convex portion. For instance, the uneven rear side continuously may extend from a surrounding radiator grill or the emblem or object symbolizing the vehicle maker.

When the metallic texture layer 100a is formed on the uneven rear side of the resin layer 10, a steric metallic texture reflected light section having a desired shape may be obtained.

The metallic texture layer 100a may comprise an optical film layer 30a and a germanium layer 40a. In the optical film layer 30a, metal oxides such as ceramics, having different refractive indexes may be alternately layered. The germanium layer 40a may be a layer including germanium (Ge), which is a semiconductor.

The metallic texture layer 100a may suitably reflect light to thus exhibit a metallic texture and may have electric conductivity less than that of a convention metallic material. Accordingly, the metallic texture layer 100a may have increased or substantially increased radio-wave penetrability.

Preferably, in the metallic texture layer 100a, the multilayered optical film layer 30a may include a first refractive layer including a material having greater refractive index, for example, $TiO_2$ or $Cr_2O_3$, and a second refractive layer including a material having a less refractive index, for example, $SiO_2$. Preferably, the first refractive layer and the second refractive layer may be alternately layered therein. When the first refractive layer and the second refractive layer are alternately layered, constant reflectance may be maintained in a visible light band and achromatic reflected light may be obtained so as to exhibit a metallic texture.

Preferably, when the multilayered optical film layer 30a is formed, the first refractive layer including $TiO_2$ may be disposed so as to be closest to the resin layer 10 or at least closer to the resin layer than the second refractive resin layer. This may be because the adhesion strength of $TiO_2$ is greater than that of other materials. When $TiO_2$ is first layered on the resin layer 10, the possibility of stripping between the resin layer 10 and the multilayered optical film layer 30a may be reduced. The second refractive layer comprising $SiO_2$ having greater hardness may improve scratch resistance of the multilayered optical film layer 30a. In addition, $SiO_2$ included in the second refractive layer may implement the reflected light, which is the characteristic of the metal.

The thicknesses of the first and second refractive layers of the multilayered optical film layer 30a may be controlled to fall within the range from about 10 to about 200 nm, the total thickness thereof may be controlled to fall within the range from about 300 nm to about 10 µm. Moreover, three or more layers of the first and second refractive layers may be included in the optical film layer, thereby minimizing differentiation of colors depending on the reflection angle and reflecting light that exhibits a metallic texture.

The germanium layer 40a may be disposed so as to reflect light exhibiting a further distinct metallic texture on the multilayered optical film layer 30a. Since germanium exhibits a dark-colored metallic texture due to the intrinsic characteristics thereof, the metallic texture layer 100a including the multilayered optical film layer 30a and the germanium layer 40a may reflect light exhibiting a chrome-colored metallic texture that is slightly darker than that of typical chrome-reflected light. The dark chrome color may improve the appearance of parts.

When the thickness of the germanium layer 40a is about 10 µm or greater, the penetrability of the radio waves of the radar may be substantially reduced. Accordingly, the thickness of the germanium layer 40 may be about 5 µm or less so as to prevent the radio-wave penetrability from being reduced. On the other hand, when the thickness of the germanium layer 40a is less than about 50 nm, light reflection exhibiting a further distinct metallic texture on the multilayered optical film layer 30a may not be obtained. Therefore, the thickness of the germanium layer 40a must fall within the range from about 50 nm to about 5 µm.

The germanium layer 40a may be formed on the rear side of the multilayered optical film layer 30a, that is, between the multilayered optical film layer 30a and the reflection layer 50, but may be formed at another position in another embodiment of the present invention. A description thereof will be given below.

Light may be reflected to thus exhibit a metallic texture without exhibiting different colors (a phenomenon whereby only a specific color is noticeable). Preferably, the total visible ray reflectance of the metallic texture layer 100a including the multilayered optical film layer 30a and the germanium layer 40a may be about 30% or greater and the reflectance deviation in a visible ray region may be about 5% P or less.

Preferably, the rear side of the resin layer 10 may be uneven and the metallic texture layer 100a may be formed on the uneven rear side. Since the sensation of different colors is easily caused by the reflectance deviation on the sterically uneven side compared to the flat side, light may be reflected on the uneven rear side of the resin layer 10 and may exhibit an achromatic, without color, metallic texture only when the reflectance and deviation limits set forth in the present invention are satisfied.

The reflection layer 50 may be formed on the rear side of the metallic texture layer 100a using opaque paint, preferably black paint. The reflection layer may improve the reflectance of the metallic texture layer 100a, thereby increasing the brightness of the reflected light.

After the metallic texture layer 100a is formed, the reflection layer 50 may be formed on the rear side of the metallic texture layer, thereby increasing the brightness of the light reflected on the metallic texture layer 100a to thus exhibit the metallic texture and ensuring environmental and scratch resistance.

The coating layer of the present invention may further include a primer layer 20 between the resin layer 10 and the metallic texture layer 100a. The primer layer 20 may provide a gloss or matte effect to the light, reflected on the metallic texture layer 100a to exhibit the metallic texture, thereby improving the appearance of the coating layer.

The coating layer of the present invention may further include a masking layer comprising opaque paint, preferably black paint, between the resin layer 10 and the multilayered optical film layer 30a.

The masking layer may cover at least a portion of the multilayered optical film layer 30a to thus define a section of the multilayered optical film layer on which the light is reflected to exhibit the metallic texture, thereby providing a predetermined structure or a pattern. The structure may be a pattern or design for a radiator grill, an emblem, or a symbol. The uneven rear side of the resin layer 10 and the masking layer may be combined to ensure the steric section, on which the light is reflected to exhibit the metallic texture.

The masking layer may define the section of the multilayered optical film layer on which the light is reflected to exhibit the metallic texture in the embodiment of the present invention. However, the present invention is not limited thereto, and the section embodying the metallic texture may be defined using various processes for etching the metallic texture layer 100a.

Figure 3:
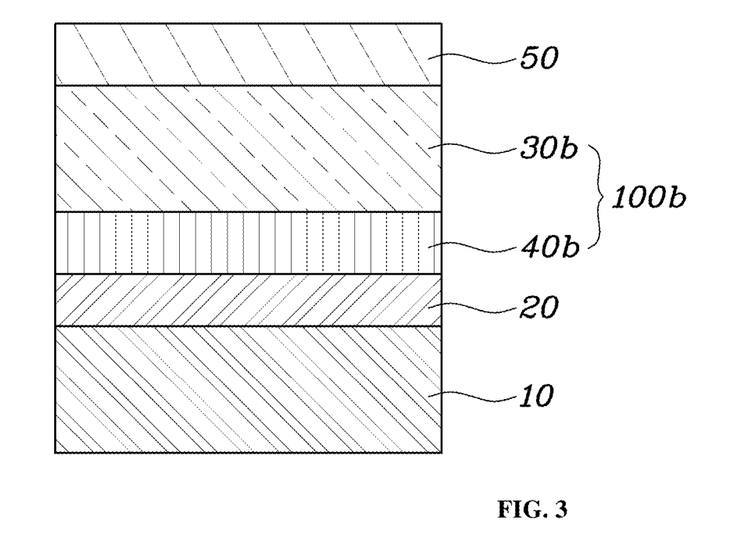
FIG. 3 illustrates an exemplary structure of an exemplary coating layer having a metallic luster according to an exemplary embodiment of the present invention.
Figure 4:
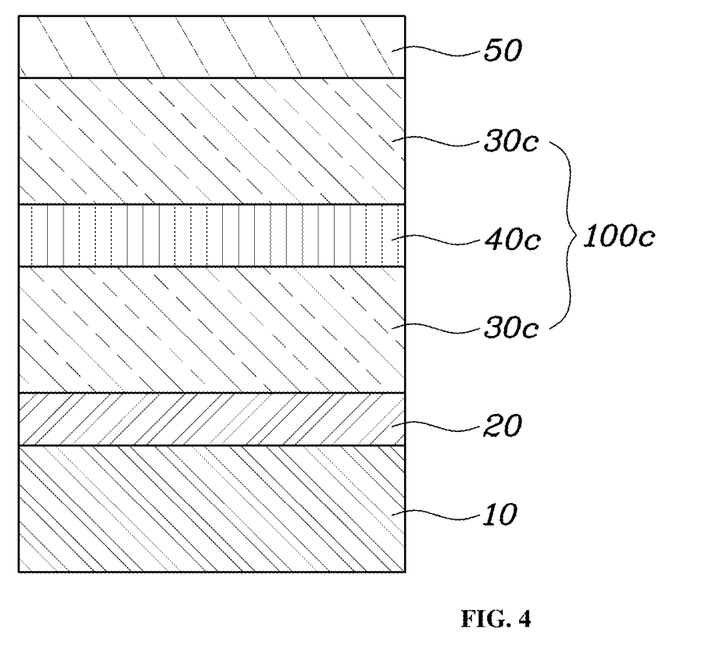
FIG. 4 illustrates an exemplary structure of an exemplary coating layer having a metallic luster according to an exemplary embodiment of the present invention.

The structure or pattern of the metallic texture layer according to the present invention is not limited to one Example shown in FIG. 2, but may be modified as shown in FIGS. 3 and 4.

For instance, as shown in FIG. 3, a germanium layer 40b may be formed between the resin layer 10 and a multilayered optical film layer 30b to constitute a metallic texture layer 100b. Alternatively, as shown in FIG. 4, a germanium layer 40c may be formed in the multilayered optical film layers 30c to constitute a metallic texture layer 100c.

When the germanium layer 40c is formed between the multilayered optical film layers 30c, it is preferable that the germanium layer 40c be formed between the first refractive layer and the second refractive layer of the multilayered optical film layers 30c.

The method for forming the metallic texture layers 100a, 100b, and 100c is not particularly limited in the present invention. However, for example, the metallic texture layers may be deposited on the resin layer 10 using a PVD or PACVD process, or the resin layer 10 may be subjected to sputtering.

For instance, Ar gas may be converted into a plasma in a vacuum state, and a bias may be applied to wash and activate the surface of the resin layer 10, particularly the rear side of the resin layer, thereby increasing the stickiness between a mother material and the deposited layer. An e-beam may be radiated on the samples of the high refractive material ($TiO_2$ and/or $Cr_2O_3$) and the low refractive material ($SiO_2$) to form the multilayered optical film layer 30a on the surface of the resin layer, or the e-beam may be radiated on the germanium (Ge) sample to form the germanium layer 40a.

Hereinafter, the effects of the Examples of the present invention will be described.

A conventional radiator grill for use in vehicle exteriors is plated with chrome. Therefore, reflectance similar to that of chrome may be required in order to realize a metallic texture similar to that of the radiator grill. A change in the reflectance of typical chrome, a change in the reflectance of a tin-deposited layer of the related art, and a change in the reflectance of the metallic texture layer 100a including the multilayered optical film layer 30a and the germanium layer 40a of an exemplary coating layer according to the present invention in a visible light region (a wavelength of 400 to 700 nm) were numerically calculated using a Macleod analytic program, and the calculated values are described in Table 1.

In Table 1, Comparative Examples 1 to 5 were samples where the monolayer of each material was formed on the resin layer. Examples 1 to 4 are samples where the resin layer 10, the primer layer 20, the multilayered optical film layer 30a, the germanium layer 40a, and the opaque reflection layer 50 are sequentially formed as in FIG. 2. Comparative Examples 1 to 5 are different from Examples 1 to 4 in terms only of the number of multilayered optical film layers 30a.

TABLE 1

| | Material | Thickness (nm) | Number of layers | Visible ray (wavelength of 400 to 700 nm) reflectance % | | | | | | | |
|---|---|---|---|---|---|---|---|---|---|---|---|
| | | | | 400 | 450 | 500 | 550 | 600 | 650 | 700 | Max − Min |
| Comparative Example 1 | Cr | 20 | Monolayer | 33.23 | 35.21 | 36.34 | 36.2 | 34.05 | 31.97 | 31.46 | 4.88 |
| Comparative Example 2 | | 30 | | 40.17 | 42.32 | 43.26 | 43.25 | 42.03 | 40.79 | 39.82 | 3.44 |
| Comparative Example 3 | | 100 | | 41.41 | 43.44 | 43.3 | 42.21 | 41.82 | 42.48 | 43.36 | 2.03 |
| Comparative Example 4 | Sn | 100 | | 27.98 | 27.9 | 28.63 | 29.55 | 29.83 | 29.25 | 28.05 | 1.93 |
| Comparative Example 5 | Ge | 50~10000 | Monolayer | 26.25 | 23.8 | 21.36 | 21.44 | 22.8 | 21.73 | 26.63 | 4.89 |
| Example 1 | Ge + | 306 | 3 | 34.37 | 33.21 | 31.94 | 31.34 | 31.61 | 31.79 | 32.46 | 3.03 |
| Example 2 | Multilayered | 526.3 | 7 | 42.56 | 45.52 | 44.01 | 46.05 | 47.05 | 45.22 | 41.7 | 0.28 |
| Example 3 | optical | 674 | 11 | 50.29 | 52.77 | 50.11 | 52.6 | 54.48 | 52.3 | 46.26 | 4.38 |
| Example 4 | film | 1,549 | 15 | 56 | 63.8 | 63.39 | 63.2 | 63.32 | 61.94 | 62.03 | 2.28 |

As shown in Table 1, the reflectance was 30% or greater in the entire visible ray region and that the max-min deviation of the reflectance is 5% P or less based on the reflectance of chrome of Comparative Examples 1 to 3 in Table 1. This means that the brightness must be a predetermined value or greater, e.g. 30% or greater, and that the reflectance may be required to be uniform throughout the entire visible ray region in order to realize a chrome texture.

In addition, tin of Comparative Example 4 had low reflectance deviation, light was reflected on tin to exhibit an achromatic metallic texture, but the brightness was reduced due to the total reflectance of less than about 30%. Further, germanium of Comparative Example 5 had low reflectance due to its intrinsic dark color.

On the other hand, Examples 1 to 4 having the total thickness of the multilayered optical film layers 30a of about 300 nm or greater and including layers of 3 or greater satisfied the condition that the reflectance was 30% or greater and the reflectance deviation was 5% P or less in the visible light region. As the number of multilayered optical film layers 30a was increased, the reflectance in the visible ray region was increased, which increase the brightness of the reflected light, and the reflectance deviation is 5% P or less in all Examples. Accordingly, a metallic texture may be exhibited without differentiation in colors when the light is reflected.

Figure 5:
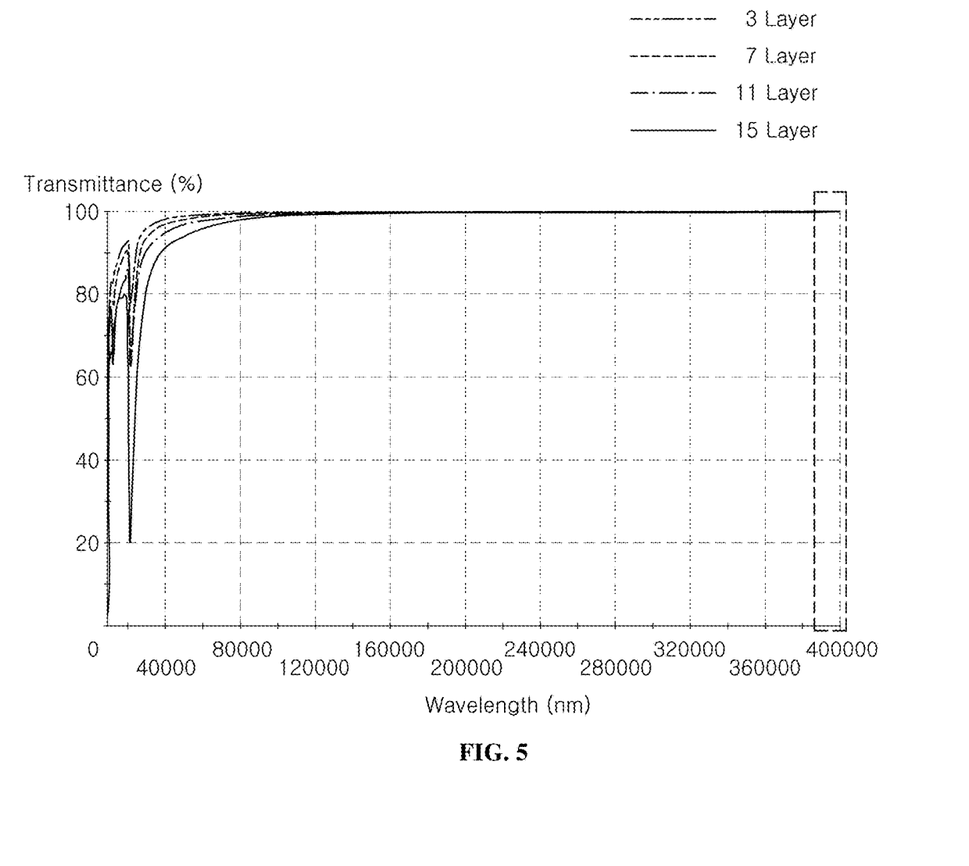
FIG. 5 is a graph showing a change in radio-wave penetrability depending on a number of layers in an exemplary optical film layers according to an exemplary embodiment of the present invention.

FIG. 5 shows the result of measurement of the radio-wave penetrability of Examples 1 to 4 of Table 1. It can be seen that the penetrability of the radio wave having a frequency of 76 to 77 GHz used in an SCC radar was almost 100% in a radio wave wavelength region (dotted rectangular region) of 400000 nm even when the number of multilayered optical film layers 30a was increased. This may be due to characteristic whereby the multilayered optical film layer 30a includes metal oxide such as a ceramic material, which does not interfere with the radio waves of the radar, and accordingly, the radio-wave penetrability may not depend on the thickness.

Figure 6:
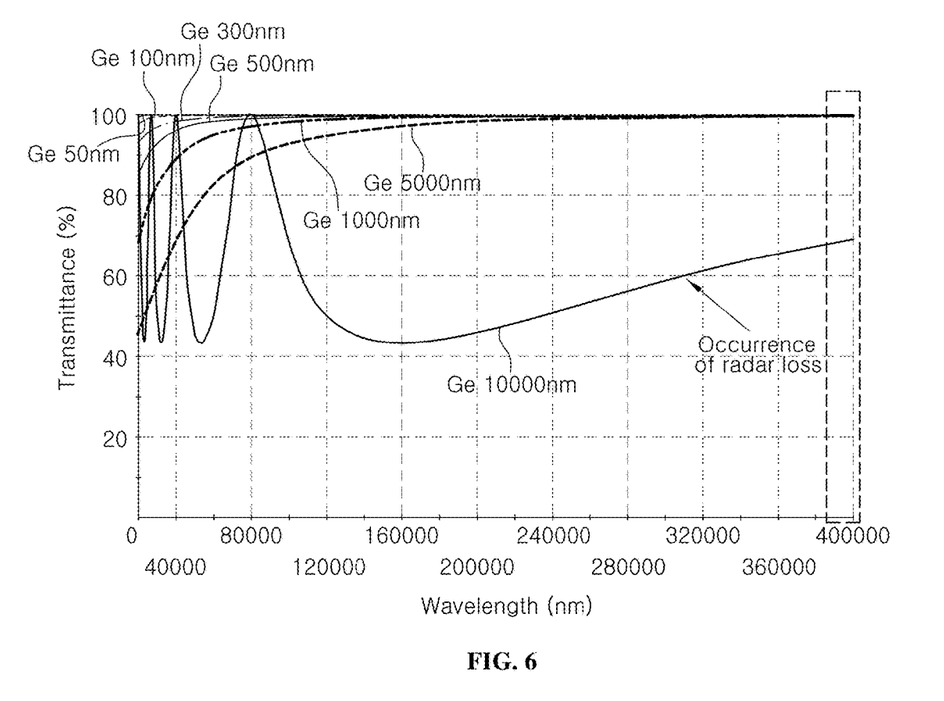
FIG. 6 is a graph showing a change in radio-wave penetrability depending on a thickness of an exemplary germanium layer according to an exemplary embodiment of the present invention.

Meanwhile, as shown in FIG. 6, when the thickness of the germanium layer 40a exceeded 5 μm and reached 10 μm, the penetrability of the radio wave having the frequency of 76 to 77 GHz used in the radar was rapidly reduced in the wavelength region (dotted rectangular region) of 400000 nm. Germanium as used herein is a semiconductor but exhibits conductivity when germanium has a thickness of a predetermined value or greater, which impedes the penetration of the radio waves of the radar. Accordingly, the thickness of the germanium layer 40a suitably may be limited to about 5 μm or less.

The sample of the metallic texture layer 100a according to the present invention and the conventional indium-coated sample were manufactured, and the damping ratio and the straightness of the radio waves of the radar were measured with respect to the samples. The result is described in Table 2.

An exemplary coating layer was deposited on a plate, which had a thickness of 1 mm and included a PC material, to thus manufacture each sample. Indium (In) was deposited in Comparative Example 6. In Examples 5 to 7, the germanium layer 40a and the multilayered optical film layer 30a were included, and the respective numbers of multilayered optical film layers 30a was 3, 7, and 15.

TABLE 2

|  | Material | Number of layers | Damping ratio of radar [dB] | Radar beam tilt [X-axis degree] | Radar beam tilt [Y-axis degree] |
| --- | --- | --- | --- | --- | --- |
| Comparative Example 6 | In | Mono-layer | −0.66 | 0.04 | 0.06 |
| Example 5 | Ge + Multi- | 3 | −0.66 | 0.02 | 0.04 |
| Example 6 | layered | 7 | −0.66 | 0.02 | 0.04 |
| Example 7 | optical film | 15 | −0.66 | 0.02 | 0.04 | the damping ratio and the refraction angle were measured at a frequency of the radio wave of the radar of 76 to 77 GHz using a RAS (radar alignment system) measuring device.

As shown in Table 2, the radio-wave penetrability of the sample of the metallic texture layer 100a according to Examples 5 to 7 was the same as the radio-wave penetrability of the indium-coated sample according to Comparative Example 6 regardless of the number of multilayered optical film layers 30a, and that the straightness of the radar beam was the same as or greater than that of the sample of Comparative Example 6.

Preferably, a damping ratio of the radar suitable for the coating layer according to the present invention may be about −4 dB or less (−4 to 0 dB) on the basis of round-trip penetration and about −1.8 dB or less (−1.8 to 0 dB) on the basis of one-way penetration.

TABLE 3

| Classification | Thickness of germanium layer (nm) | Number of multilayered optical film layers | Visible ray (wavelength of 400 to 700 nm) reflectance (%) | | | | | | | |
| --- | --- | --- | --- | --- | --- | --- | --- | --- | --- | --- |
| | | | 400 | 450 | 500 | 550 | 600 | 650 | 700 | Max − Min |
| Example 8 (FIG. 2) | 406 | 5 | 43.56 | 43.52 | 42.01 | 44.35 | 44.02 | 43.22 | 40.1 | 4.25 |
| Example 9 (FIG. 3) | 400 | 5 | 40.02 | 42.9 | 41.82 | 40.9 | 40 | 39.7 | 38.8 | 3.1 |
| Example 10 (FIG. 4) | 408 | 5 | 41.56 | 41.22 | 39.01 | 41.05 | 40.65 | 40.22 | 38.76 | 2.8 |

The cover samples comprising the coating layers of the Examples of FIGS. 2 to 4 were manufactured, the reflectance of each sample was analyzed using a Macleod analytic program, and the results are set forth in Table 3.

During analysis, the numbers of multilayered optical film layers 30a, 30b, and 30c were maintained the same, (i.e. 5 layers), in the samples, but the germanium layers 40a, 40b, and 40c were positioned on different sides, that is, on the rear side of the multilayered optical film layer (on the opaque reflection layer), on the front side of the multilayered optical film layer (on the resin layer), and between the multilayered optical film layers (between the first and second refractive layers).

As a result, the reflectance of the metallic texture layer 100b including the multilayered optical film layer 30b and the germanium layer 40b, formed on the rear side of the multilayered optical film layer 30b, that is, the reflectance of Example 8, was greatest. However, the reflectances of all samples were 38 to 44%, greater than at least 30%, in the visible light wavelength region. Further, the reflectance deviations of all samples were 5% P or less in the visible ray region. Accordingly, an achromatic metallic texture may be exhibited when light is reflected.

TABLE 4

| Classification | Damping ratio of radar [dB] | Radar beam tilt [X-axis degree] | Radar beam tilt [Y-axis degree] |
| --- | --- | --- | --- |
| Example 8 (FIG. 2) | −1.65 | 0.12 | 0.07 |
| Example 9 (FIG. 3) | −1.5 | 0.13 | 0.07 |
| Example 10 (FIG. 4) | −1.47 | 0.13 | 0.08 |

The damping ratio and the straightness of the samples having the measured reflectance of Table 3 were evaluated using an RAS measuring device during one-way penetration of radio waves having a frequency of 76 to 77 GHz and a wavelength of 400000 nm. The results are described in Table 4.

As shown in FIG. 4, the damping ratio and the straightness of the radio waves of the radar did not significantly depend on the position of the germanium layer, and consistent performance was obtained.

Figure 7:
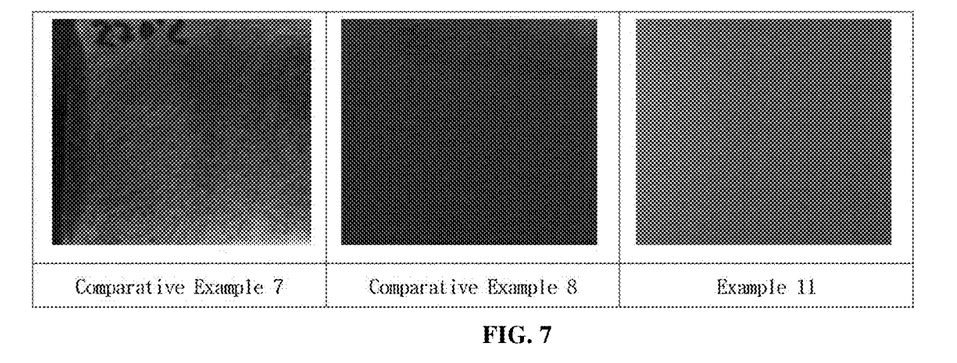
FIG. 7 shows images of surface of Comparative Examples 7 and 8 and Example 11 according to an exemplary embodiment of the present invention after heat treatment at a temperature of 220° C. for 5 min.

The sample of the metallic texture layer 100a according to the present invention and the indium- and germanium-coated samples were manufactured, and the high-temperature durability of the samples was examined. The results are shown in FIG. 7.

A target structure was deposited on a glass substrate to manufacture each sample. Indium, germanium, and the multilayered optical film layer 30a with the germanium layer 40a were deposited in Comparative Example 7, Comparative Example 8, and Example 11, respectively. Subsequently, in order to measure environmental resistance at high temperatures, the respective samples were heat-treated at a temperature of 220° C. for 5 min to confirm the degree of deformation of the deposition surface. Deformation was confirmed from the many cracks formed in the surface in Comparative Example 7, but no cracks were formed in the surface in Comparative Example 8 or in Example 11.

TABLE 5

| Applied material | In | Ge | $TiO_2$ | $SiO_2$ |
| --- | --- | --- | --- | --- |
| Melting point (° C.) | 156 | 939 | 1,670 | 1,975 |

As shown in FIG. 7 and Table 5, since the melting point of germanium or metal oxide such as $TiO_2$ or $SiO_2$ was greater than that of indium, the surface was not deformed even when exposed to a high-temperature environment. Since a radiator grill for vehicles is a part that is closely positioned to an engine and may be constantly exposed to high temperatures, the materials of the present invention may be applied instead of indium, which has a low melting point, thereby improving the durability and the lifespan.

Thermal deformation, such as surface cracks, did not occur in Comparative Example 8, using only germanium, but the sample of Comparative Example 8 had a color that was darker than that of Example 11. This is because the brightness of the reflected light may be reduced due to the low reflectance of germanium, as in Comparative Example 5 of Table 1.

Various exemplary embodiments of the present invention have been described with reference to the accompanying drawings, but those skilled in the art will appreciate that the present invention may be embodied in other specific forms without changing the technical spirit or essential features.

Thus, exemplary and preferred embodiments described above should be understood to be illustrative in every way and non-limiting. The scope of the invention is represented by the claims below rather than the aforementioned detailed description, and all of the changes or modified forms that are derived from the meaning, range, and equivalent concepts of the appended claims should be construed to be included in the scope of the present invention.

What is claimed is:

1. A coating layer for a vehicle part, comprising:
   a resin layer having a front side exposed to an outside and a rear side opposite to the front side;
   a metallic texture layer formed on the rear side of the resin layer, wherein the metal texture layer comprises i) an optical film layer comprising metal oxides having different refractive indexes and ii) a germanium (Ge) layer configured to reflect light; and
   a reflection layer formed on a rear side of the metallic texture layer.

2. The coating layer of claim 1, wherein the resin layer is transparent and the reflection layer is opaque.

3. The coating layer of claim 1, wherein the optical film layer comprises a first refractive layer comprising any one of $TiO_2$ or $Cr_2O_3$ and a second refractive layer comprising $SiO_2$.

4. The coating layer of claim 1, wherein in the optical film layer, the first refractive layer and the second refractive layer are alternately layered, and the first refractive layer is disposed closer to the resin layer than the second refractive layer.

5. The coating layer of claim 1, wherein the metallic texture layer has a reflectance of about 30% or greater and a reflectance deviation of about 5% P or less in a visible ray region of a wavelength of about 400 to about 700 nm.

6. The coating layer of claim 3, wherein each of the first refractive layer and the second refractive layer has a thickness of about 10 to 200 nm.

7. The coating layer of claim 3, wherein the optical film layer comprises three or more layers comprising the first refractive layers and the second refractive layers and has a total thickness of about 300 nm to about 10 μm.

8. The coating layer of claim 4, wherein the germanium layer is formed on a front side of the optical film layer, on a rear side of the optical film layer, or between the alternately layered first refractive layer and the second refractive layer.

9. The coating layer of claim 8, wherein the germanium layer has a total thickness of about 50 nm to 5 μm.

10. The coating layer of claim 1, wherein the front side of the resin layer has a flat or curved front surface having no concavo-convex portion, and the rear side has a surface having a concave portion and a convex portion.

11. The coating layer of claim 1, further comprising:
a primer layer formed between the resin layer and the metallic texture layer.

12. The coating layer of claim 1, further comprising:
a masking layer formed between the resin layer and the metallic texture layer, the masking layer covering at least a portion of the metallic texture layer,
wherein the masking layer comprises an opaque paint to cover a remaining portion other than a portion having a predetermined shape.

13. A vehicle part comprising a coating layer of claim 1.

14. The vehicle part of claim 13 is a front grill of a vehicle.

* * * * *